United States Patent
Fujii et al.

(10) Patent No.: US 10,107,876 B2
(45) Date of Patent: Oct. 23, 2018

(54) MAGNETISM MEASUREMENT APPARATUS, GAS CELL, METHOD FOR MANUFACTURING MAGNETISM MEASUREMENT APPARATUS, AND METHOD FOR MANUFACTURING GAS CELL

(71) Applicant: SEIKO EPSON CORPORATION, Tokyo (JP)

(72) Inventors: Eiichi Fujii, Shiojiri (JP); Kimio Nagasaka, Hokuto (JP); Mitsutoshi Miyasaka, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 305 days.

(21) Appl. No.: 14/886,808

(22) Filed: Oct. 19, 2015

(65) Prior Publication Data
US 2016/0109538 A1    Apr. 21, 2016

(30) Foreign Application Priority Data
Oct. 21, 2014   (JP) .................................. 2014-214254

(51) Int. Cl.
*G01R 33/26* (2006.01)
*G01R 33/00* (2006.01)
*G01R 33/032* (2006.01)

(52) U.S. Cl.
CPC ......... *G01R 33/26* (2013.01); *G01R 33/0052* (2013.01); *G01R 33/032* (2013.01)

(58) Field of Classification Search
CPC ... G01R 33/26; G01R 33/0052; G01R 33/032

USPC .............................. 324/244–244.1, 260, 305
See application file for complete search history.

(56) References Cited

U.S. PATENT DOCUMENTS

| | | | |
|---|---|---|---|
| 6,048,241 A | 4/2000 | Traksel et al. | |
| 6,917,276 B1 | 7/2005 | Menard et al. | |
| 7,652,473 B2 * | 1/2010 | Kawabata ............ | G01R 33/032 324/301 |
| 7,826,065 B1 * | 11/2010 | Okandan ................ | G01B 11/02 324/244.1 |
| 8,373,413 B2 * | 2/2013 | Sugioka ................. | G01R 33/26 324/304 |

(Continued)

FOREIGN PATENT DOCUMENTS

| | | |
|---|---|---|
| JP | H09-185944 A | 7/1997 |
| JP | H10-263873 A | 10/1998 |

(Continued)

OTHER PUBLICATIONS

D. Budker et al. "Resonant Nonlinear Magento-Optical Effects in Atoms". Reviews of Modern Physics, vol. 74, Oct. 2002, pp. 1153-1201.

*Primary Examiner* — Patrick Assouad
*Assistant Examiner* — Sean Curtis
(74) *Attorney, Agent, or Firm* — Oliff PLC

(57) ABSTRACT

A magnetism measurement apparatus that measures a magnetic field includes a gas cell including a primary chamber, a reservoir, and a exhaust hole that allows the primary chamber and the reservoir to communicate with each other. The primary chamber and the reservoir are filled with an alkali metal gas, and at least one of an alkali metal solid and an alkali metal liquid is placed in the reservoir.

12 Claims, 5 Drawing Sheets

(56) References Cited

U.S. PATENT DOCUMENTS

| | | | | |
|---|---|---|---|---|
| 8,432,162 B2* | 4/2013 | Nagasaka | G01R 33/26 | 324/244.1 |
| 8,904,627 B2* | 12/2014 | Nagasaka | G01R 33/0076 | 29/428 |
| 8,957,677 B2* | 2/2015 | Nagasaka | G01R 33/0322 | 324/244 |
| 8,964,293 B2* | 2/2015 | Nagasaka | G01R 33/032 | 250/428 |
| 9,024,634 B2* | 5/2015 | Hokari | G01R 33/26 | 324/305 |
| 9,203,026 B2* | 12/2015 | Tanaka | H03L 7/26 | |
| 9,274,182 B2* | 3/2016 | Ueno | G01R 33/032 | |
| 9,318,750 B2* | 4/2016 | Nagasaka | H01M 6/005 | |
| 9,521,958 B2* | 12/2016 | Nagasaka | A61B 5/04005 | |
| 9,684,041 B2* | 6/2017 | Nagasaka | G01R 33/26 | |
| 9,720,058 B2* | 8/2017 | Ueno | G01R 33/032 | |
| 2009/0001979 A1* | 1/2009 | Kawabata | G01R 33/032 | 324/244.1 |
| 2010/0156419 A1* | 6/2010 | Sugioka | G01R 33/26 | 324/318 |
| 2010/0308814 A1* | 12/2010 | Wu | G01R 33/032 | 324/244.1 |
| 2010/0327861 A1* | 12/2010 | Nagasaka | G01R 33/26 | 324/244.1 |
| 2010/0327862 A1* | 12/2010 | Nagasaka | G01R 33/26 | 324/244.1 |
| 2011/0101974 A1* | 5/2011 | Nagasaka | G01R 33/0322 | 324/244.1 |
| 2012/0206135 A1* | 8/2012 | Nagasaka | G01R 33/26 | 324/244.1 |
| 2012/0243088 A1* | 9/2012 | Nagasaka | G01R 33/032 | 359/484.1 |
| 2012/0249132 A1* | 10/2012 | Hokari | G01R 33/26 | 324/244 |
| 2013/0047417 A1* | 2/2013 | Nagasaka | G01R 33/0076 | 29/592.1 |
| 2013/0093421 A1* | 4/2013 | Ueno | G01R 33/032 | 324/260 |
| 2013/0214773 A1* | 8/2013 | Ueno | G01R 33/032 | 324/244.1 |
| 2013/0230673 A1* | 9/2013 | Nagasaka | A61B 5/04005 | 428/34.1 |
| 2014/0306700 A1* | 10/2014 | Kamada | G01R 33/26 | 324/244.1 |
| 2014/0320123 A1* | 10/2014 | Kobayashi | G01R 33/26 | 324/244.1 |
| 2015/0054504 A1* | 2/2015 | Ichihara | G01R 33/26 | 324/305 |
| 2015/0107097 A1* | 4/2015 | Nagasaka | G01R 33/032 | 29/731 |
| 2015/0171325 A1* | 6/2015 | Tanaka | H01L 49/006 | 331/94.1 |
| 2015/0346293 A1* | 12/2015 | Bulatowicz | G01C 19/62 | 324/305 |
| 2015/0369427 A1* | 12/2015 | Nagasaka | F17C 13/00 | 206/0.6 |
| 2016/0001942 A1* | 1/2016 | Fujii | G01R 33/26 | 220/359.1 |
| 2016/0023401 A1* | 1/2016 | Fujii | G01R 33/0052 | 156/272.8 |
| 2016/0025822 A1* | 1/2016 | Takahashi | G01R 33/032 | 324/244.1 |
| 2016/0097824 A1* | 4/2016 | Fujii | G01R 33/032 | 324/244.1 |
| 2016/0109538 A1* | 4/2016 | Fujii | G01R 33/26 | 324/305 |
| 2016/0139215 A1* | 5/2016 | Fujii | G01R 33/26 | 324/305 |
| 2016/0139216 A1* | 5/2016 | Ueno | G01R 33/032 | 324/304 |
| 2016/0169989 A1* | 6/2016 | Suzuki | G01R 33/26 | 324/305 |
| 2016/0313417 A1* | 10/2016 | Kawabata | G01R 33/26 | |
| 2016/0313418 A1* | 10/2016 | Fujii | G01R 33/26 | |
| 2016/0334475 A1* | 11/2016 | Ueno | G01R 33/032 | |
| 2017/0199251 A1* | 7/2017 | Fujii | G01R 33/0052 | |
| 2017/0299663 A1* | 10/2017 | Nagasaka | G01R 33/032 | |

FOREIGN PATENT DOCUMENTS

| | | |
|---|---|---|
| JP | 2012-183290 A | 9/2012 |
| JP | 2013-181941 A | 9/2013 |
| JP | 2016095262 A * | 5/2016 |

* cited by examiner

MAGNETISM MEASUREMENT APPARATUS, GAS CELL, METHOD FOR MANUFACTURING MAGNETISM MEASUREMENT APPARATUS, AND METHOD FOR MANUFACTURING GAS CELL

BACKGROUND

1. Technical Field

The present invention relates to a magnetism measurement apparatus, a gas cell, a method for manufacturing the magnetism measurement apparatus, and a method for manufacturing the gas cell.

2. Related Art

There is a known optically pumping magnetism measurement apparatus that irradiates a gas cell having an alkali metal gas enclosed therein with linearly polarized light and measures a magnetic field in accordance with the angle of rotation of the polarization plane. JP-A-2012-183290 discloses a magnetism measurement apparatus including a gas cell that is made of glass and accommodates an ampule formed of a glass tube having an alkali metal enclosed in a hollow portion of the tube. In the magnetism measurement apparatus, the ampule is so irradiated with laser light that a through hole is formed through the ampule (glass tube), and the alkali metal in the ampule is evaporated so that the cell is filled with the vapor (gas) of the alkali metal.

When the concentration of the alkali metal gas in the gas cell is low or unstable, the performance of the magnetism measurement apparatus decreases, resulting in imprecise measurement in some cases or the magnetism measurement apparatus does not function in other cases. It is therefore required to provide a magnetism measurement apparatus that can be stably manufactured with variation in the concentration of the alkali metal gas in the gas cell suppressed and is therefore capable of highly precise measurement and further provide a method for manufacturing the magnetism measurement apparatus.

SUMMARY

An advantage of some aspects of the invention is to solve at least a part of the problems described above, and the invention can be implemented as the following aspects or application examples.

Application Example 1

A magnetism measurement apparatus according to this application example is a magnetism measurement apparatus that measures a magnetic field, and the apparatus includes a gas cell including a first chamber, a second chamber, and a exhaust section that allows the first chamber and the second chamber to communicate with each other. The first chamber and the second chamber are filled with a gas of an alkali metal, and at least one of a solid and a liquid of the alkali metal is placed in the second chamber.

According to the configuration of this application example, at least one of a solid and a liquid of the alkali metal is placed in the second chamber. A gas that is an evaporated form of the alkali metal is therefore stably supplied into the second chamber, as compared with a case where no solid or liquid of the alkali metal is placed in the second chamber, and if an unnecessary gas is produced in the second chamber, not only the gas of the alkali metal but also the solid or liquid of the alkali metal contribute to a reaction with the unnecessary gas, whereby the amount of the unnecessary gas in the second chamber can be more quickly reduced. As a result, diffusion of the unnecessary gas into the first chamber, which communicates with the second chamber, can be suppressed, and the amount of the gas of the alkali metal that flows from the second chamber into the first chamber can be increased. Therefore, in the second chamber and the first chamber, the reaction between the unnecessary gas and the gas of the alkali metal can be more quickly completed, whereby the concentration of the gas of the alkali metal can be stabilized. As a result, a gas cell and a magnetism measurement apparatus that can be stably manufactured with a decrease or variation in the concentration of the gas of the alkali metal in the gas cell suppressed and can measure a magnetic field with high precision can be provided.

Application Example 2

In the magnetism measurement apparatus according to the application example described above, it is preferable that glass pieces are placed in the second chamber, and that at least one of the solid and the liquid of the alkali metal attaches to the glass pieces.

According to the configuration of this application example, in which at least one of the solid and the liquid of the alkali metal attaches to the glass pieces placed in the second chamber, even if an unnecessary gas is produced from the glass pieces, the solid or liquid of the alkali metal as well as the gas of the alkali metal react with the unnecessary gas, whereby the amount of the unnecessary gas in the second chamber can be reduced. Further, since the surfaces of the glass pieces to which the solid or liquid of the alkali metal attaches are covered with the solid or liquid of the alkali metal, no unnecessary gas is newly produced, unlike a case where no solid or liquid of the alkali metal attaches to the glass pieces. As a result, diffusion of the unnecessary gas into the first chamber, which communicates with the second chamber, can be suppressed, whereby the concentration of the gas of the alkali metal can be more quickly stabilized in the second chamber and the first chamber.

Application Example 3

In the magnetism measurement apparatus according to the application example described above, it is preferable that each of the first chamber and the second chamber is made of first glass, and that the glass pieces are made of second glass different from the first glass.

According to the configuration of this application example, even if the first glass and the second glass (glass pieces) produce unnecessary gases in the second chamber, the solid or liquid of the alkali metal reacts with the unnecessary gases and the amount of the unnecessary gases in the second chamber can therefore be reduced, whereby diffusion of the unnecessary gases into the first chamber can be suppressed. Further, even if the first glass produces an unnecessary gas in the first chamber and the unnecessary gas reacts with the gas of the alkali metal so that the amount of the gas of the alkali metal decreases, the solid or liquid of the alkali metal placed in the second chamber evaporates and diffuses into the first chamber, whereby the concentration of the gas of the alkali metal in the first chamber can be stabilized.

Application Example 4

In the magnetism measurement apparatus according to the application example described above, it is preferable that the first glass is allowed to have a thickness ranging from 1 to 5 mm, and that the second glass is allowed to have a thickness ranging from 0.1 to 0.5 mm.

According to the configuration of this application example, since the thickness of the second glass is about 1/10 of the thickness of the first glass, radiation of laser light or application of impact, for example, can break the second glass more readily than the first glass. Therefore, when an ampule which is made of the second glass and in which the alkali metal is enclosed is placed in the second chamber of the gas cell made of the first glass, and the ampule is selectively processed and broken, at least one of the solid and the liquid of the alkali metal can be placed in the second chamber, and a vapor that is an evaporated form of the alkali metal can be diffused from the second chamber into the first chamber, which is thus filled with the evaporated alkali metal.

Application Example 5

In the magnetism measurement apparatus according to the application example described above, it is preferable that transmittance of the first glass at which the first glass transmits ultraviolet light is higher than transmittance of the second glass at which the second glass transmits the ultraviolet light.

According to the configuration of this application example, since the transmittance of the first glass at which the first glass transmits ultraviolet light is higher than the transmittance of the second glass at which the second glass transmits the ultraviolet light, the absorption coefficient of the first glass at which the first glass absorbs the ultraviolet light is smaller than the absorption coefficient of the second glass at which the second glass absorbs the ultraviolet light. As a result, when the first glass and the second glass are irradiated with laser light in an ultraviolet region, the laser light passes through the first glass but is absorbed by the second glass. The ampule made of the second glass can thus be selectively processed with no damage of the gas cell made of the first glass.

Application Example 6

In the magnetism measurement apparatus according to the application example described above, it is preferable that the exhaust section has a diameter ranging from 0.4 to 1 mm.

According to the configuration of this application example, since the exhaust section has a small diameter ranging from 0.4 to 1 mm, the solid and the liquid of the alkali metal are unlikely to pass through the exhaust section. Therefore, vapor that is an evaporated form of the solid or liquid of the alkali metal produced in the second chamber can be diffused into the first chamber with no entry of the solid or liquid of the alkali metal placed in the second chamber into the first chamber.

Application Example 7

A gas cell according to this application example includes a first chamber, a second chamber, and a exhaust section that allows the first chamber and the second chamber to communicate with each other. The first chamber and the second chamber are filled with a gas of an alkali metal, and at least one of a solid and a liquid of the alkali metal is placed in the second chamber.

According to the configuration of this application example, at least one of the solid and the liquid of the alkali metal is placed in the second chamber. A gas of the alkali metal is therefore stably supplied into the second chamber, as compared with a case where no solid or liquid of the alkali metal is placed in the second chamber, and if an unnecessary gas is produced in the second chamber, not only the gas of the alkali metal but also the solid or liquid of the alkali metal contribute to a reaction with the unnecessary gas, whereby the amount of the unnecessary gas in the second chamber can be more quickly reduced. As a result, diffusion of the unnecessary gas into the first chamber, which communicates with the second chamber, can be suppressed, and the amount of the gas of the alkali metal that flows from the second chamber into the first chamber can be increased. Therefore, in the second chamber and the first chamber, the reaction between the unnecessary gas and the gas of the alkali metal can be more quickly completed, whereby the concentration of the gas of the alkali metal can be stabilized. As a result, a gas cell and a magnetism measurement apparatus that can be stably manufactured with a decrease or variation in the concentration of the gas of the alkali metal in the gas cell suppressed can be provided.

Application Example 8

A method for manufacturing a magnetism measurement apparatus according to this application example is a method for manufacturing a magnetism measurement apparatus that measures a magnetic field, and the method includes providing a gas cell including a first chamber, a second chamber, and a exhaust section that allows the first chamber and the second chamber to communicates with each other, placing an ampule in which a solid of an alkali metal is enclosed in the second chamber of the gas cell, and hermetically sealing the first chamber, the second chamber, and the exhaust section, breaking the ampule to place at least one of the solid and a liquid of the alkali metal in the second chamber, and filling the first chamber and the second chamber with the gas of the alkali metal.

According to the manufacturing method of this application example, the ampule having a solid of an alkali metal enclosed therein is placed in the second chamber of the gas cell, and hermetically sealing the first chamber, the second chamber, and the exhaust section, and the ampule is broken in the second chamber to place at least one of the solid of the alkali metal and a liquid that is a melted form of the solid of the alkali metal in the second chamber. A gas of the alkali metal is therefore stably supplied into the second chamber, when a through hole is formed on the ampule to cause the alkali metal to evaporate, and if an unnecessary gas is produced in the second chamber, not only the gas of the alkali metal but also the solid or liquid of the alkali metal contribute to a reaction with the unnecessary gas, whereby the amount of the unnecessary gas in the second chamber can be more quickly reduced. As a result, diffusion of the unnecessary gas into the first chamber, which communicates with the second chamber, can be suppressed, and the amount of the gas of the alkali metal that flows from the second chamber into the first chamber can be increased. Therefore, in the second chamber and the first chamber, the reaction between the unnecessary gas and the gas of the alkali metal can be more quickly completed, whereby the concentration of the gas of the alkali metal can be stabilized. As a result, a decrease or variation in the concentration of the gas of the alkali metal in the gas cell is suppressed, whereby a magnetism measurement apparatus capable of measuring a magnetic field with high precision can be stably manufactured.

Application Example 9

In the method for manufacturing a magnetism measurement apparatus according to the application example described above, the ampule may be broken by irradiating the ampule with laser light.

According to the manufacturing method of this application example, in which the ampule is so irradiated with laser light that the ampule is broken, at least one of the solid and the liquid of the alkali metal can be placed in the second chamber.

Application Example 10

In the method for manufacturing a magnetism measurement apparatus according to the application example described above, the ampule may be broken by applying impact to the ampule.

According to the manufacturing method of this application example, in which impact is so applied to the ampule that the ampule is broken, at least one of the solid and the liquid of the alkali metal can be placed in the second chamber.

Application Example 11

A method for manufacturing a gas cell according to this application example includes placing an ampule in which a solid of an alkali metal is enclosed in a second chamber that communicates with a first chamber via a exhaust section and hermetically sealing the first chamber, the exhaust section, and the second chamber, breaking the ampule to place at least one of a solid and a liquid of the alkali metal in the second chamber, and filling the first chamber and the second chamber with a gas of the alkali metal.

According to the manufacturing method of this application example, the ampule having a solid of an alkali metal enclosed therein is placed in the second chamber, which communicates with the first chamber via the exhaust section and hermetically sealing the first chamber, the exhaust section, and the ampule is broken in the second chamber to place at least one of the solid of the alkali metal and a liquid that is a melted form of the solid of the alkali metal in the second chamber. A gas of the alkali metal is therefore stably supplied into the second chamber, when a through hole is formed on the ampule to cause the alkali metal to evaporate, and if an unnecessary gas is produced in the second chamber, not only the gas of the alkali metal but also the solid or the liquid of the alkali metal contribute to a reaction with the unnecessary gas, whereby the amount of the unnecessary gas in the second chamber can be more quickly reduced. As a result, diffusion of the unnecessary gas into the first chamber, which communicates with the second chamber, can be suppressed, and the amount of the gas of the alkali metal that flows from the second chamber into the first chamber can be increased. Therefore, in the second chamber and the first chamber, the reaction between the unnecessary gas and the gas of the alkali metal can be more quickly completed, whereby the concentration of the gas of the alkali metal can be stabilized. As a result, a decrease or variation in the concentration of the gas of the alkali metal in the gas cell is suppressed, whereby a gas cell capable of measuring a magnetic field with high precision can be stably manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
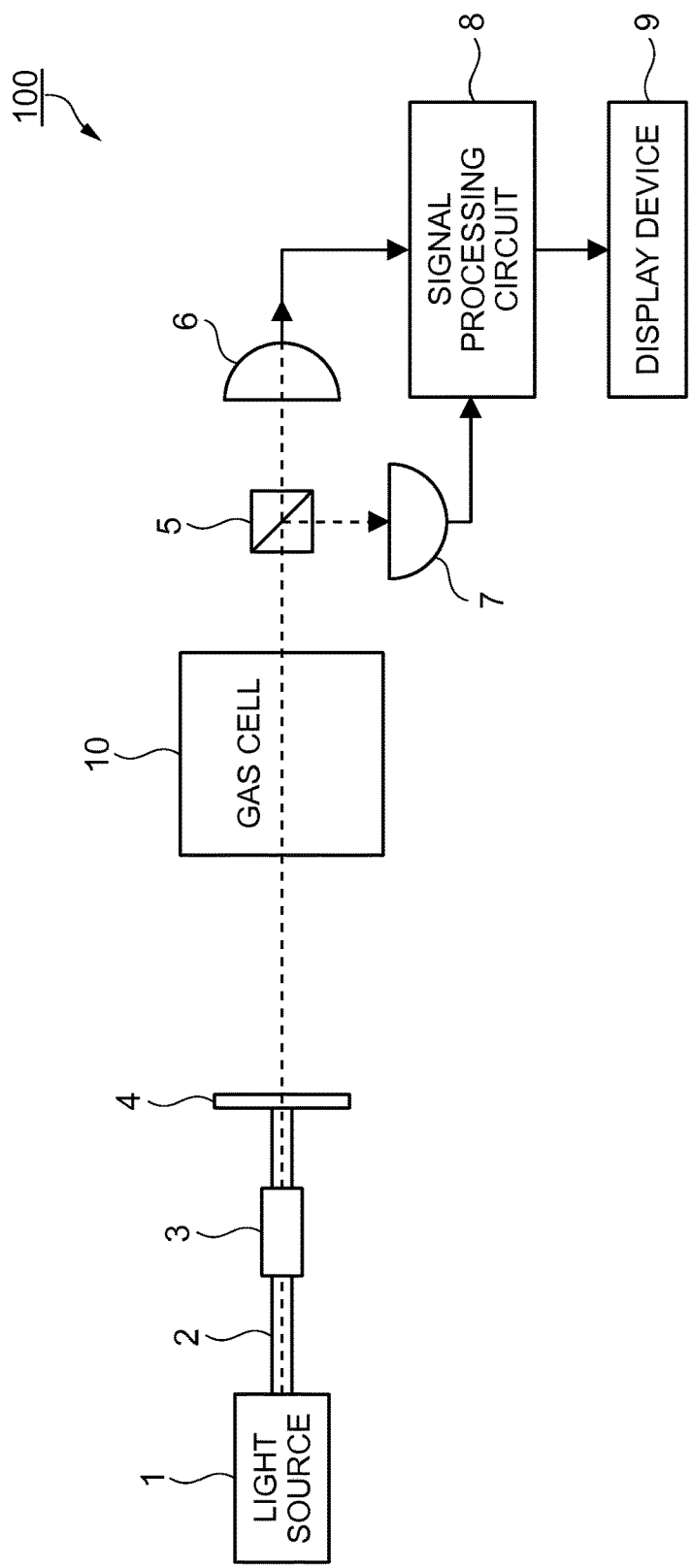
FIG. 1 is a block diagram showing the configuration of a magnetism measurement apparatus according to an embodiment of the invention.

An embodiment that embodies the invention will be described below with reference to the drawings. The drawings to be used in the description are appropriately enlarged, reduced, or emphasized so that a portion being described is recognizable. Further, components other than those necessary for the description are omitted in the drawings in some cases.

Configuration of Magnetism Measurement Apparatus

The configuration of a magnetism measurement apparatus according to the present embodiment will be described with reference to FIG. 1. FIG. 1 is a block diagram showing the configuration of the magnetism measurement apparatus according to the present embodiment. A magnetism measurement apparatus 100 according to the present embodiment is a magnetism measurement apparatus based on nonlinear magneto-optical rotation (NMOR). The magnetism measurement apparatus 100 is used, for example, in a biological state measurement apparatus that measures a weak magnetic field produced by a biological body, such as a magnetic field from the heart (cardio-magnetism) and a magnetic field from the brain (encephalo-magnetism). The magnetism measurement apparatus 100 can also be used in a metal detector and other apparatus.

The magnetism measurement apparatus 100 includes a light source 1, an optical fiber 2, a connector 3, a polarizer 4, a gas cell 10, a polarization separator 5, a photo detector (PD) 6, a photo detector 7, a signal processing circuit 8, and a display device 9, as shown in FIG. 1. The gas cell 10 has an alkali metal gas (gaseous alkali metal atom) enclosed therein. Examples of the alkali metal may include cesium (Cs), rubidium (Rb), potassium (K), and sodium (Na). The following description will be made with reference to a case where cesium is used as the alkali metal.

The light source 1 is a device that outputs a laser beam having a wavelength according to an absorption line of cesium (for example, 894 nm, which corresponds to D1 line), for example, a tunable laser. The laser beam outputted from the light source 1 is what is called CW (continuous wave) light, which has a continuously fixed amount of light.

The polarizer 4 is an element that polarizes the laser beam in a specific direction to form linearly polarized light. The optical fiber 2 is a member that guides the laser beam outputted from the light source 1 toward the gas cell 10. For example, a single-mode optical fiber, which allows only a fundamental mode to propagate, is used as the optical fiber 2. The connector 3 is a member for connecting the optical fiber 2 to the polarizer 4. The connector 3 is screwed into the polarizer 4 to connect the optical fiber 2 to the polarizer 4.

Figure 2A:
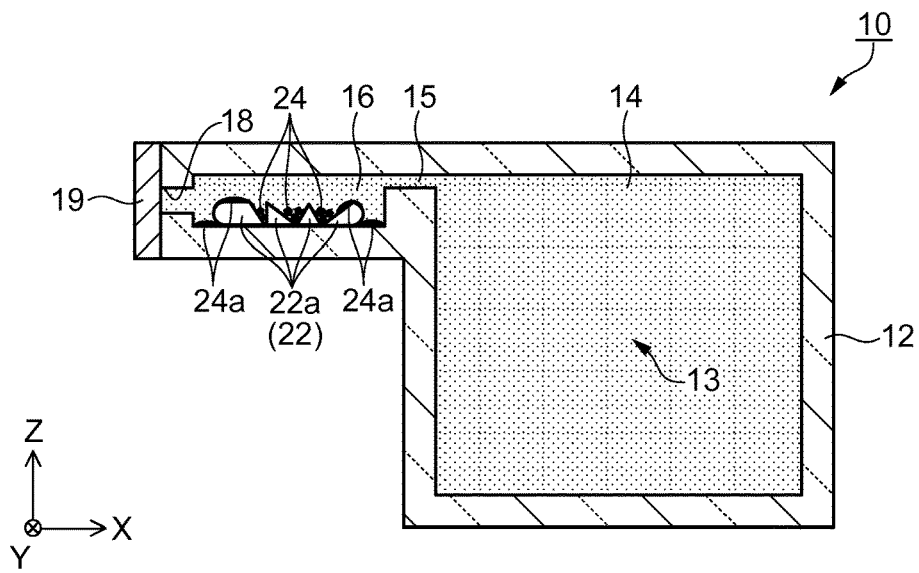
FIGS. 2A to 2C are schematic cross-sectional views showing the configurations of a gas cell and an ampule according to the present embodiment.

The gas cell 10 is a cell having a cavity therein, and the cavity (primary chamber 14 shown in FIG. 2A) encloses vapor of the alkali metal (alkali metal gas 13 shown in FIG. 2A). The configuration of the gas cell 10 will be described later.

The polarization separator 5 is an element that separates the laser beam incident thereon into two beams having polarization components perpendicular to each other. The polarization separator 5 is, for example, a Wollaston prism or a polarizing beam splitter. Each of the photo detectors 6 and 7 is a detector having sensitivity at the wavelength of the laser beam and outputs current according to the amount of light incident on the detector to the signal processing circuit 8. Each of the photo detectors 6 and 7 is desirably made of a nonmagnetic material because the detector is likely to affect magnetism measurement if the detector itself produces a magnetic field. The photo detectors 6 and 7 are disposed on the same side (downstream) of the polarization separator 5 relative to the gas cell 10.

A description will be made of the arrangement of the components of the magnetism measurement apparatus 100 along the path of the laser beam. The light source 1 is located in the most upstream position on the path of the laser beam, and the optical fiber 3, the connector 3, the polarizer 4, the gas cell 10, the polarization separator 5, and the photo detectors 6 and 7 are then arranged in this order from the upstream side.

The action of each of the components of the magnetism measurement apparatus 100 will be described along the direction in which the laser beam travels. The laser beam outputted from the light source 1 is guided through the optical fiber 2 and reaches the polarizer 4. The laser beam having reached the polarizer 4 is converted into linearly polarized light having a higher degree of polarization. The laser beam passing through the gas cell 10 excites (optically pumps) the alkali metal atom enclosed in the gas cell 10. At this point, the laser beam experiences rotation of the polarization plane thereof under a polarization plane rotation effect according to the intensity of a magnetic field. The laser beam having passed through the gas cell 10 is separated by the polarization separator 5 into two beams having different polarization components. The magnitudes of the two beams having different polarization components are measured (probed) with the photo detectors 6 and 7.

The signal processing circuit 8 receives signals representing the magnitudes of the light beams measured with the photo detectors 6 and 7 therefrom. The signal processing circuit 8 measures the angle of rotation of the polarization plane of the laser beam based on the received signals. The angle of rotation of the polarization plane is expressed by a function based on the intensity of the magnetic field in the direction in which the laser beam propagates (see numerical expression (2) in D. Budker and five others, "Resonant nonlinear magneto-optical effects in atoms," Review of Modern Physics, USA, American Institute of Physics, October 2002, Vol. 74, No. 4, pp. 1153-1201. Although numerical expression (2) relates to linear optical rotation, roughly the same expression can be used in NMOR). The signal processing circuit 8 measures the intensity of the magnetic field in the direction in which the laser beam propagates based on the angle of rotation of the polarization plane. The display device 9 displays the intensity of the magnetic field measured with the signal processing circuit 8.

Figure 2B:
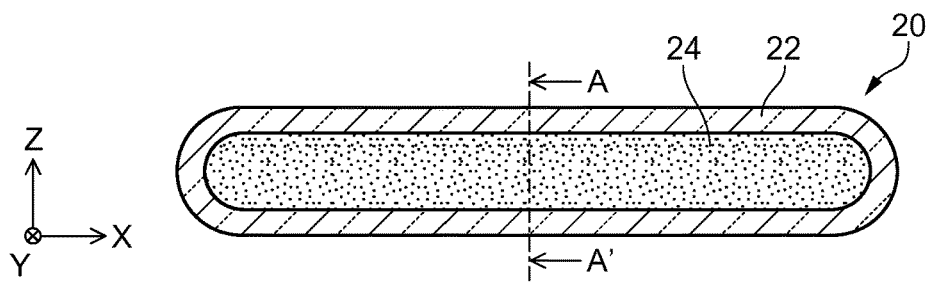
Figure 2C:
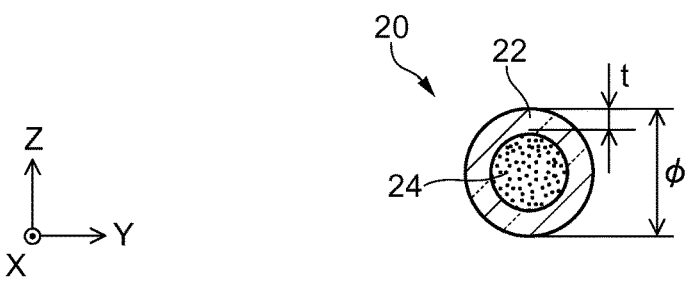

The gas cell according to the present embodiment and the ampule used in the gas cell will be subsequently described with reference to FIGS. 2A to 2C. FIGS. 2A to 2C are schematic cross-sectional views showing the configurations of the gas cell and the ampule according to the present embodiment. In detail, FIG. 2A is a schematic cross-sectional view of the gas cell, FIG. 2B is a schematic cross-sectional view of the ampule, and FIG. 2C is a schematic cross-sectional view taken along the line A-A' in FIG. 2B.

Configuration of Gas Cell

FIG. 2A shows a schematic cross section of the gas cell 10 according to the present embodiment. In FIG. 2A, it is assumed that the height direction of the gas cell 10 is the direction along a Z axis and an upward direction is a +Z direction. It is further assumed that a direction that intersects the Z axis and represents the length of the gas cell 10 is the direction along an X axis, and that the rightward direction in FIG. 2A is called a +X direction. It is still further assumed that a direction that intersects the Z axis and the X axis and represents the width of the gas cell 10 is the direction along a Y axis, and that the direction from the reader's side of the plane of view in FIG. 2A toward the side away from the reader's side is a +Y direction.

The gas cell 10 according to the present embodiment is formed of a cell section 12 and a sealing section 19, as shown in FIG. 2A. The cell section 12 is a cell having a cavity provided therein and is made of quartz glass as first glass. The inner wall of the sell section 12 may be coated, for example, with paraffin. The thickness of the cell section 12 ranges from 1 to 5 mm and is, for example, about 1.5 mm.

The cell section 12 has a primary chamber 14 as a first chamber and a reservoir 16 as a second chamber, and the primary chamber 14 and the reservoir 16 form the internal cavity. The primary chamber 14 and the reservoir 16 are arranged side by side along the X direction and communicate with each other via a exhaust hole 15. The exhaust hole 15 is provided on the upper side of the primary chamber 14 and the reservoir 16 (shifted in +Z direction). The inner diameter of the exhaust hole 15 ranges, for example, from about 0.4 to 1 mm.

The cell section 12 has an end portion on the side where the reservoir 16 is present, and an opening 18 is provided through the end portion. The opening 18 is sealed with the sealing section 19 so that the cell section 12 (primary chamber 14 and the reservoir 16) is hermetically sealed. The sealing section 19 is made, for example, of low-melting-point glass frit.

The primary chamber 14 and the reservoir 16 are filled with an alkali metal vapor gas (hereinafter referred to as alkali metal gas) 13. A rare gas or any other inert gas may be present in the primary chamber 14 and the reservoir 16 as well as the alkali metal gas 13. In the reservoir 16 are placed glass pieces 22a, the alkali metal in a solid state (hereinafter referred to as alkali metal solid) 24, and the alkali metal in a melted liquid state (hereinafter referred to as alkali metal liquid) 24a. The alkali metal solid 24 and the alkali metal liquid 24a attach to the glass pieces 22a.

The glass pieces 22a are a plurality of divided pieces produced by breakage of a glass tube 22 of an ampule 20 (see FIG. 2B), which will be described later. The alkali metal solid 24 is enclosed in the ampule 20 before the breakage and discharged when the ampule 20 is broken. The alkali metal liquid 24a is produced when the alkali metal solid 24 is melted with heat. The alkali metal gas 13 is an evaporated form of the alkali metal solid 24 and the alkali metal liquid 24a.

Only one of the alkali metal solid 24 and the alkali metal liquid 24a may be placed in the reservoir 16, or only one of the alkali metal solid 24 and the alkali metal liquid 24a may be attached to the glass pieces 22a.

Configuration of Ampule

FIG. 2B shows an X-Z cross section of the ampule 20. The ampule 20 according to the present embodiment is formed of a hollow glass tube 22, as shown in FIG. 2B. The glass tube 22 is made of borosilicate glass as a second glass.

The glass tube 22 extends in one direction (X axis in FIG. 2B), and opposite ends of the glass tube 22 are welded. The hollow glass tube 22 is thus hermetically sealed. Each of the opposite ends of the glass tube 22 does not necessarily have the rounded shape as shown in FIG. 2B and may have a roughly flat shape or a partially pointed shape. The hollow portion of the glass tube 22 is filled with the alkali metal solid (particulate or powdery alkali metal atom) 24. The alkali metal solid 24 can be rubidium, potassium, or sodium in place of cesium, as described above.

FIG. 2B shows a state in which the ampule 20 (glass tube 22) is hermetically sealed, that is, before it is broken. At the time when the ampule 20 is manufactured, the glass tube 22 is hermetically sealed, and at the time when the gas cell 10 shown in FIG. 2A is completed, the glass tube 22 has been broken. Further, at the latter point of time, the alkali metal solid 24 and the alkali metal liquid 24a discharged from the interior of the ampule 20 have been placed in the reservoir 16, and the reservoir 16 and the primary chamber 14 have been filled with the alkali metal gas 13.

To readily allow the alkali metal solid 24 and the alkali metal liquid 24a to evaporate in the reservoir 16 and the resultant alkali metal gas 13 to flow out through the exhaust hole 15 into the primary chamber 14, a gap having a size of, for example, about 1.5 mm is provided between the upper surface of the ampule 20 and the inner surface of the cell section 12.

FIG. 2C shows a Y-Z cross section of the ampule 20. The glass tube 22 has, for example, a roughly circular Y-Z cross-sectional shape as shown in FIG. 2C but may have another shape. The outer diameter ϕ of the glass tube 22 satisfies 0.2 mm≤ϕ≤1.2 mm. The thickness t of the glass tube 22 satisfies 0.1 mm≤t≤0.5 mm and is preferably about 20% of the outer diameter ϕ. When the thickness t of the glass tube 22 is smaller than 0.1 mm, the glass tube 22 tends to unpreparedly break, whereas when the thickness t of the glass tube 22 is greater than 0.5 mm, it is difficult to break the glass tube 22 (breaking operation will be described later in detail).

Method for Manufacturing Gas Cell

Figure 3A:
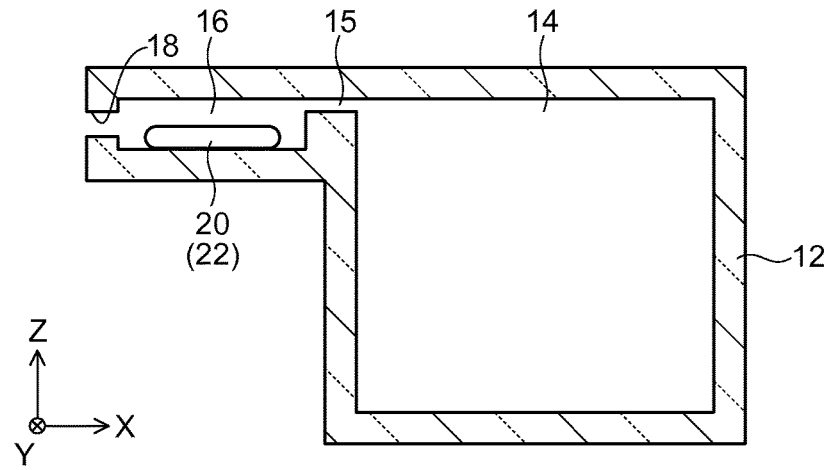
FIGS. 3A to 3C describe a method for manufacturing the gas cell according to the present embodiment.
Figure 3B:
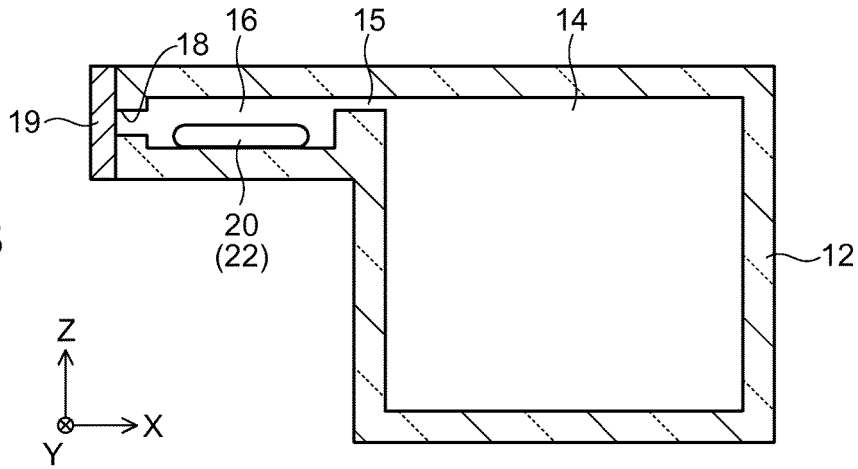
Figure 3C:
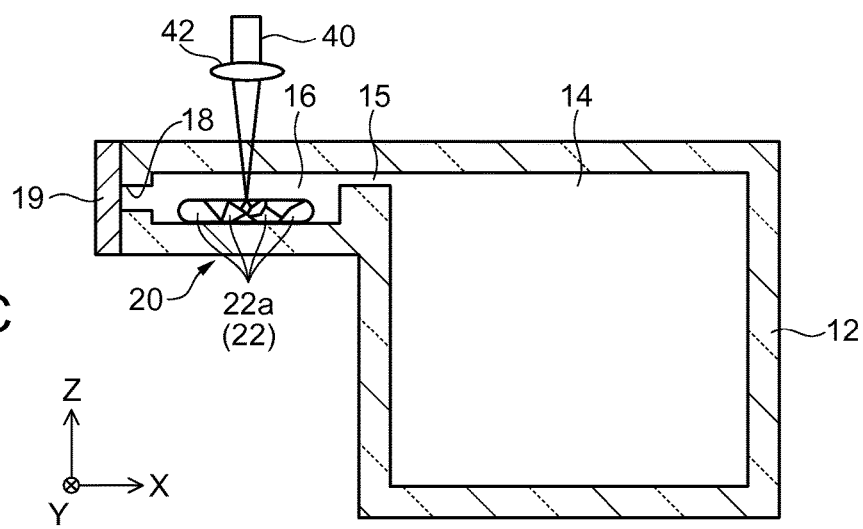

A method for manufacturing the gas cell 10 will be described with reference to FIGS. 3A to 3C. FIGS. 3A to 3C describe a method for manufacturing the gas cell according to the present embodiment.

The cell section 12 shown in FIG. 3A is first prepared. Although not shown, for example, a glass plate made of quartz glass is so cut that glass plate members corresponding to walls that form the cell section 12 are provided. The glass plate members are then assembled and bonded to each other with an adhesive or by welding to form the cell section 12 having the primary chamber 14 and the reservoir 16 shown in FIG. 3A. At this point, the opening 18 of the cell section 12 is open.

The ampule 20 is subsequently accommodated in the reservoir 16 of the cell section 12. The ampule 20 is inserted through the opening 18, which is provided through the cell section 12 and located on the side where the reservoir 16 is present, and accommodated in the reservoir 16. At this point, the ampule 20 has a state in which the hollow glass tube 22 is filled with the alkali metal solid 24 and hermetically sealed, as shown in FIG. 2B.

The ampule 20 is formed under a low-pressure environment close to a vacuum state (ideally in vacuum) by filling the hollow portion of the tubular glass tube 22 with the alkali metal solid 24 and welding the opposite ends of the glass tube 22 so that the glass tube 22 is hermetically sealed. Since the alkali metal used as the alkali metal solid 24, such as cesium, is very reactive and cannot therefore be handled in the atmosphere, the alkali metal hermetically enclosed under the low-pressure environment in the ampule 20 is accommodated in the cell section 12.

The interior of the cell section 12 shown in FIG. 3A is subsequently degassed sufficiently, and the cell section 12 (primary chamber 14, the exhaust hole 15, and the reservoir 16) is sealed with an extremely small amount of impurity in the inner cavity, as shown in FIG. 3B. For example, the opening 18 of the cell section 12 is sealed with the sealing section 19 under a low-pressure environment close to a vacuum state (ideally in vacuum) so that the cell section 12 is hermetically sealed.

The ampule 20 (glass tube 22) is subsequently processed, as shown in FIG. 3C. In this step, the glass tube 22 is so broken that the cell section 12 is not damaged but the ampule 20 is no longer hermetically sealed, so that the alkali metal solid 24 in the ampule 20 is discharged into the reservoir 16. The breakage of the glass tube 22 refers to formation of a through hole that passes through the glass tube 22 or division of the glass tube 22 into a plurality of glass pieces 22a.

For example, in the case where a through hole is formed through the glass tube 22, it is necessary to discharge the alkali metal solid 24 in the ampule 20 through the formed through hole into the reservoir 16. The diameter of the through hole, which may range from about 10 to 50 μm, is therefore preferably greater (100 μm or greater, for example), and the number of through holes, which may be one, is preferably two or more. Further, from a viewpoint of reliable discharge of the alkali metal solid 24, the glass tube 22 is preferably divided into a plurality of glass pieces 22a, as shown in FIG. 3C.

In the present embodiment, as a method for breaking the glass tube 22, pulsed laser light 40 as the laser light is focused through a focusing lens 42, and the glass tube 22 of the ampule 20 is irradiated with the focused laser light via the cell section 12 from above (along +Z direction). Since laser light excels in directivity and convergence, the glass tube 22 can be readily processed.

A lens having, for example, a focal length of 78 mm as the focusing lens 42 focuses the pulsed laser light 40 to a beam spot diameter of about 10 μm. Since the gap having a size of about 1.5 mm is provided between the upper surface of the ampule 20 and the inner surface of the cell section 12, bringing the pulsed laser light 40 into focus at the upper surface of the glass tube 22 can reduce a risk of damage of the cell section 12.

Figure 4:
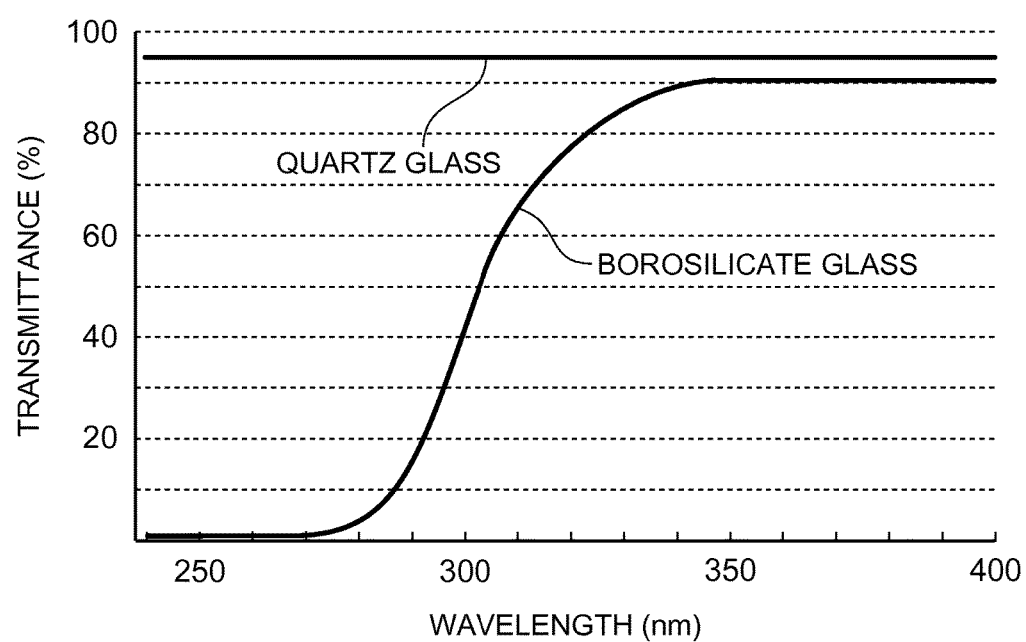
FIG. 4 shows the relationship between the wavelength of light and the transmittance of glass materials.

In the present embodiment, pulsed laser light having a wavelength ranging from 248 to 355 nm, which belongs to a wavelength band of the ultraviolet light region, is used as the pulsed laser light 40. FIG. 4 shows the relationship between the wavelength of light and the transmittance of glass materials. The transmittance of quarts glass hardly changes and stays at about 95% over the range of wavelengths of light from 250 to 400 nm, as shown in FIG. 4.

On the other hand, the transmittance of borosilicate glass shown in FIG. 4, which is about 0% up to a wavelength of light of 270 nm, increases over a range from 270 to 350 nm, and becomes about 90% over 350 nm. The transmittance shown in FIG. 4 is presented by way of example. For example, the transmittance of borosilicate glass may differ from the example shown in FIG. 4 in some cases in accordance with the mixture ratio among components that form the borosilicate glass.

As described above, the transmittance of quartz glass is higher than the transmittance of borosilicate glass for the light having a wavelength that belongs to the wavelength band of the ultraviolet light region (hereinafter referred to as ultraviolet light). In other words, quartz glass has an absorption coefficient smaller than the absorption coefficient of borosilicate glass for the ultraviolet light. The pulsed laser light 40, which belongs to the ultraviolet light, therefore passes through the cell section 12, which is made of quartz glass, but is absorbed by the glass tube 22, which is made of borosilicate glass. The glass tube 22 can thus be selectively processed with no damage of the cell section 12.

In the present embodiment, third harmonic generation (THG) laser light from a YAG laser is used as the pulsed laser light 40. Instead, fourth harmonic generation (FHG) laser light can be used. The pulsed laser light 40 is, for example, set as follows: The energy thereof ranges from about 50 to 200 μJ/pulse; the pulse width is on the order of nanoseconds (preferably about 30 nanoseconds); the repetition frequency is 50 kHz; and the irradiation period is 100 msec.

When the glass tube 22 is irradiated with the pulsed laser light 40, the glass tube 22 is so processed that it breaks from the upper surface (outer surface) thereof along the depth direction, and the ampule 20 is no longer hermetically sealed. In this process, when the pulsed laser light 40 has high energy, not only does the glass tube 22 itself generate heat, but also the alkali metal solid 24 generates heat. Using thermal stress produced in the glass tube 22 due to the heat generation allows the glass tube 22 to easily break. Further, when the alkali metal solid 24 generates heat, it tends to evaporate, and when the alkali metal solid 24 is further heated to a temperature higher than the melting point thereof, the alkali metal solid 24 melts into the alkali metal liquid 24a. When the alkali metal solid 24 is made of cesium, the melting point of cesium is about 28.4° C.

As a result of the processing described above, the glass tube 22 is broken and therefore divided into a plurality of glass pieces 22a, and the alkali metal solid 24 is discharged from the interior of the ampule 20 into the reservoir 16, as shown in FIG. 2A. FIG. 2A shows a state in which the alkali metal solid 24 along with the alkali metal liquid 24a, which is melted alkali metal solid 24, are placed in the reservoir 16. The alkali metal solid 24 and the alkali metal liquid 24a attach to the plurality of glass pieces 22a. Instead, only one of the alkali metal solid 24 and the alkali metal liquid 24a may be placed in the reservoir 16 and attach to the plurality of glass pieces 22a.

When at least one of the alkali metal solid 24 and the alkali metal liquid 24a is thus placed in the reservoir 16, the alkali metal evaporates into the alkali metal gas 13, with which the interior of the reservoir 16 is filled. The alkali metal gas 13 then diffuses from the reservoir 16 through the exhaust hole 15 into the primary chamber 14. As a result, the reservoir 16 and the primary chamber 14 are filled with the alkali metal gas 13.

At this point, in the present embodiment, since the exhaust hole 15 is provided on the upper side of the reservoir 16 (shifted in +Z direction) and the inner diameter of the exhaust hole 15 is set at a small value ranging from about 0.4 to 1 mm, the glass pieces 22a along with the alkali metal solid 24 and the alkali metal liquid 24a are unlikely to pass through the exhaust hole 15 and enter the primary chamber 14. Therefore, the alkali metal gas 13 flows from the reservoir 16 into the primary chamber 14, but the glass pieces 22a along with the alkali metal solid 24 and the alkali metal liquid 24a do not enter the primary chamber 14.

If a substance other than the alkali metal gas 13, such as the glass pieces 22a, the alkali metal solid 24, and the alkali metal liquid 24a, enters the primary chamber 14, and when the laser beam outputted from the light source 1 and linearly polarized passes through the gas cell 10 (primary chamber 14) in the magnetism measurement apparatus 100, the amount of laser light having passed through the gas cell decreases and the performance of the magnetism measurement apparatus 100 therefore lowers.

The gas cell 10 according to the present embodiment can thus be manufactured. A method for manufacturing the magnetism measurement apparatus according to the present embodiment includes the method for manufacturing the gas cell described above. Steps of manufacturing the magnetism measurement apparatus 100 according to the present embodiment can be those of a known method except the steps of manufacturing the gas cell 10 and will therefore not described.

In the step of processing the ampule 20 described above, an unnecessary gas is produced in some cases when the glass tube 22 is broken. In particular, when the glass tube 22 melts due to the heat generation, an unnecessary gas is produced from the glass tube 22. An example of the unnecessary gas is moisture contained in the glass tube 22 (borosilicate glass). The cell section 12 (quartz glass) may also produce an unnecessary gas although the amount thereof is small.

When such an unnecessary gas is produced in the reservoir 16 or the primary chamber 14, the unnecessary gas reacts with the alkali metal gas 13 and the amount of the alkali metal gas 13 decreases by an amount according to the reaction, and the concentration of the alkali metal gas 13 with which the primary chamber 14 is filled undesirably decreases or varies. If the concentration of the alkali metal gas 13 in the primary chamber 14 decreases or varies in the primary chamber 14, the performance of the magnetism measurement apparatus 100 undesirably lowers.

To avoid such a situation, in the step of processing the ampule 20, after the glass tube 22 is broken, the broken glass tube 22 is left for a certain length of time so that unnecessary gases produced from the glass tube 22 (borosilicate glass) and the cell section 12 (quartz glass) when the ampule 20 is processed are allowed to react with the alkali metal gas 13, and then the reservoir 16 and the primary chamber 14 are filled with the alkali metal gas 13.

If the through hole is formed through the glass tube 22 but the alkali metal solid 24 is not discharged from the interior of the ampule 20 into the reservoir 16, the alkali metal gas 13 is produced only by evaporation of the alkali metal solid 24 in the ampule 20 and flows out from the interior of the ampule 20 through the through hole into the reservoir 16. Therefore, if the amount of the alkali metal gas 13 that flows out from the interior of the ampule 20 is smaller than the amount of the unnecessary gases, the unnecessary gases that have not reacted with the alkali metal gas 13 diffuse from the reservoir 16 into the primary chamber 14, and it therefore takes a long time for the unnecessary gases to complete the reaction with the alkali metal gas 13 in the reservoir 16 and the primary chamber 14. As a result, the concentration of the alkali metal gas 13 in the primary chamber 14 may undesirably decrease or vary.

In contrast, in the present embodiment, since at least one of the alkali metal solid 24 and the alkali metal liquid 24a is placed in the reservoir 16, a greater amount of alkali metal gas 13 is stably supplied, so that the amount of the alkali metal gas 13 in the reservoir 16 is greater than the amount of the unnecessary gases. Since not only the alkali metal gas 13 but also the alkali metal solid 24 and the alkali metal liquid 24a contribute to the reaction with the unnecessary gases, the unnecessary gases in the reservoir 16 can be reduced more quickly. Further, since at least one of the alkali metal solid 24 and the alkali metal liquid 24a attaches to the glass pieces 22a, and the surfaces thereof to which the alkali metal solid 24 or the alkali metal liquid 24a attaches are therefore covered therewith, no unnecessary gas is newly produced from the glass pieces 22a.

Therefore, the amount of diffusion of the unnecessary gases from the reservoir 16 into the primary chamber 14 is suppressed, and the amount of the alkali metal gas 13 that flows from the reservoir 16 into the primary chamber 14 can be increased. Even if an unnecessary gas is produced in the primary chamber 14, the unnecessary gas is allowed to react with the alkali metal gas 13 that flows in from the reservoir 16. Therefore, in the reservoir 16 and the primary chamber 14, the reaction between the unnecessary gases and the alkali metal gas 13 can be quickly completed and the concentration of the alkali metal gas 13 can be stabilized. As a result, a decrease or variation in the concentration of the alkali metal gas 13 in the primary chamber 14 of the gas cell 10 can be suppressed, whereby the gas cell 10 and the magnetism measurement apparatus 100 capable of precisely measuring a magnetic field produced in a biological body can be stably manufactured.

The embodiment described above only shows an aspect of the invention, and the embodiment can be arbitrarily changed and applied within the scope of the invention. The following variations are, for example, conceivable.

Variation 1

Figure 5A:
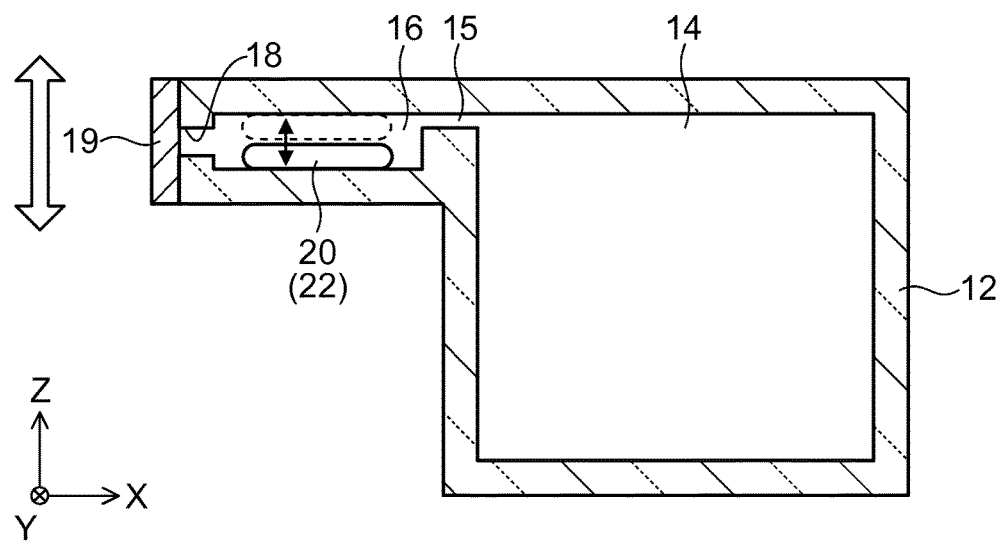
FIGS. 5A and 5B describe a gas cell manufacturing method according to Variation 1.
Figure 5B:
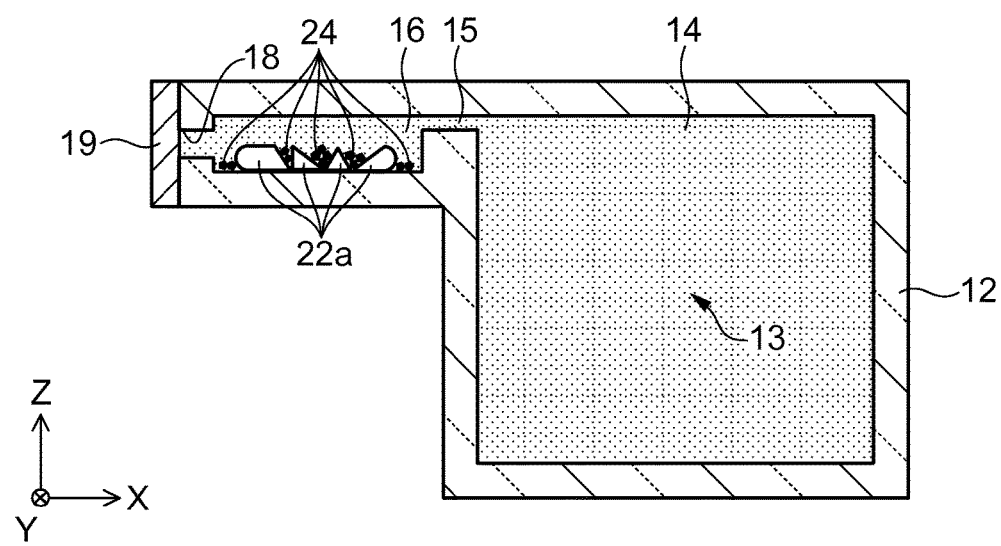

In the manufacturing method according to the embodiment described above, the glass tube 22 of the ampule 20 is irradiated with the pulsed laser light 40 for the breakage of the glass tube 22, but the invention is not limited to the configuration described above. The glass tube 22 of the ampule 20 may instead be broken by application of impact to the ampule 20. FIGS. 5A and 5B describe a gas cell manufacturing method according to Variation 1.

After the cell section 12 is hermetically sealed as shown in FIG. 3B, vibration or impact is applied to the cell section 12, as shown in FIG. 5A. Since the gap having a size of about 1.5 mm is provided between the upper surface of the ampule 20 and the inner surface of the reservoir 16 relative to the ampule 20, the outer diameter $\phi$ of which satisfies $0.2 \text{ mm} \leq \phi \leq 1.2 \text{ mm}$, the vibration or impact applied to the cell section 12 readily moves the ampule 20 in the reservoir 16. The ampule 20 therefore collides with the inner surface of the reservoir 16, and the impact produced by the collision breaks the glass tube 22 of the ampule 20. As a result, the ampule 20 (glass tube 22) can be divided into a plurality of glass pieces 22a, as shown in FIG. 5B. FIG. 5A shows a case where the vibration or impact is applied along the Z direction, but the direction in which vibration or impact is applied to the cell section 12 may instead be the Y direction.

The method for breaking the ampule 20 by applying impact thereto according to Variation 1 can prevent an unnecessary gas from being produced due to heat generation, unlike the method for irradiating the ampule 20 with the pulsed laser light 40 in the embodiment described above. FIG. 5B shows a case where the alkali metal solid 24 is not melted because no heat generation is caused to occur and no alkali metal liquid 24a (see FIG. 2A) is placed in the reservoir 16. On the other hand, in the method for breaking the ampule 20 by applying impact according to Variation 1, since the impact moves the glass pieces 22a and the alkali metal solid 24 in the reservoir 16, there is a greater risk of entry of the glass pieces 22a and the alkali metal solid 24 into the primary chamber 14 through the exhaust hole 15.

Variation 2

An apparatus in which the gas cell 10 according to the embodiment described above can be used is not limited to the magnetism measurement apparatus 100. The gas cell 10 can also be used, for example, in an atomic clock or any other atomic oscillator. A gas cell used in an atomic oscillator is required to be compact, and the method for manufacturing a gas cell according to the embodiment described above allows a compact gas cell 10 to be stably manufactured, whereby the gas cell 10 can be suitably used in a compact atomic oscillator.

The entire disclosure of Japanese Patent Application No. 2014-214254, filed Oct. 21, 2014 is expressly incorporated by reference herein.

What is claimed is:

1. An atomic oscillator comprising:
a gas cell including a first chamber, a second chamber, and an exhaust section that allows the first chamber and the second chamber to communicate with each other,
wherein the first chamber is filled with a gas of an alkali metal,
the gas of the alkali metal and at least one of a solid and a liquid of the alkali metal are placed in the second chamber, and
the exhaust section has a diameter ranging from 0.4 to 1 mm.

2. The atomic oscillator according to claim 1,
wherein glass pieces are placed in the second chamber, and
at least one of the solid and the liquid of the alkali metal attaches to the glass pieces.

3. The atomic oscillator according to claim 2,
wherein each of the first chamber and the second chamber is made of first glass, and
the glass pieces are made of second glass different from the first glass.

4. The atomic oscillator according to claim 3,
wherein the first glass has a thickness ranging from 1 to 5 mm, and the second glass has a thickness ranging from 0.1 to 0.5 mm.

5. The atomic oscillator according to claim 3,
wherein transmittance of the first glass at which the first glass transmits ultraviolet light is higher than transmittance of the second glass at which the second glass transmits the ultraviolet light.

6. A gas cell comprising:
a first chamber;
a second chamber; and
an exhaust section that allows the first chamber and the second chamber to communicate with each other,
wherein the first chamber is filled with a gas of an alkali metal,
the gas of the alkali metal and at least one of a solid and a liquid of the alkali metal are placed in the second chamber, and
the exhaust section has a diameter ranging from 0.4 to 1 mm.

7. A method for manufacturing measurement the atomic oscillator according to claim 1, the method comprising:

providing a gas cell including a first chamber, a second chamber, and an exhaust section having a diameter ranging from 0.4 to 1 mm that allows the first chamber and the second chamber to communicates with each other, placing an ampule in which a solid of an alkali metal is enclosed in the second chamber of the gas cell, and hermetically sealing a space including the first chamber, the second chamber, and the exhaust section;

breaking the ampule to place at least one of the solid and a liquid of the alkali metal and a gas of the alkali metal in the second chamber; and filling the first chamber with the gas of the alkali metal.

8. The method for manufacturing the atomic oscillator according to claim 7, wherein the ampule is broken by irradiating the ampule with laser light.

9. The method for manufacturing the atomic oscillator according to claim 7, wherein the ampule is broken by applying impact to the ampule.

10. A method for manufacturing the gas cell according to claim 6, the method comprising:

placing an ampule in which a solid of an alkali metal is enclosed in a second chamber that communicates with a first chamber via an exhaust section having a diameter ranging from 0.4 to 1 mm and hermetically sealing the first chamber, the exhaust section, and the second chamber;

breaking the ampule to place at least one of a solid and a liquid of the alkali metal in the second chamber; and filling the first chamber and the second chamber with a gas of the alkali metal.

11. An atomic oscillator comprising:

a gas cell including a first chamber, a second chamber, and an exhaust section that allows the first chamber and the second chamber to communicate with each other, wherein the first chamber is filled with a gas of an alkali metal, the gas of the alkali metal and at least one of a solid and a liquid of the alkali metal are placed in the second chamber, glass pieces are placed in the second chamber, at least one of the solid and the liquid of the alkali metal attaches to the glass pieces, each of the first chamber and the second chamber is made of first glass, the glass pieces are made of second glass different from the first glass, the first glass has a thickness ranging from 1 to 5 mm, and the second glass has a thickness ranging from 0.1 to 0.5 mm.

12. A gas cell comprising:

a first chamber;

a second chamber; and an exhaust section that allows the first chamber and the second chamber to communicate with each other, wherein the first chamber is filled with a gas of an alkali metal, the gas of the alkali metal and at least one of a solid and a liquid of the alkali metal are placed in the second chamber, glass pieces are placed in the second chamber, at least one of the solid and the liquid of the alkali metal attaches to the glass pieces, each of the first chamber and the second chamber is made of first glass, the glass pieces are made of second glass different from the first glass, the first glass has a thickness ranging from 1 to 5 mm, and the second glass has a thickness ranging from 0.1 to 0.5 mm.

\* \* \* \* \*